(12) United States Patent
Mallikarjunaswamy (10) Patent No.: US 6,650,165 B1
(45) Date of Patent: Nov. 18, 2003

(54) LOCALIZED ELECTROSTATIC DISCHARGE PROTECTION FOR INTEGRATED CIRCUIT INPUT/OUTPUT PADS

(75) Inventor: Shekar Mallikarjunaswamy, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 25 days.

(21) Appl. No.: 10/138,463

(22) Filed: May 2, 2002

(51) Int. Cl.[7] .................................................. H03K 5/08
(52) U.S. Cl. ...................................................... 327/310
(58) Field of Search ................................. 327/309, 310, 327/311, 312, 313, 314, 318, 319, 320, 333

(56) References Cited

U.S. PATENT DOCUMENTS

| | | | |
|---|---|---|---|
| 5,528,188 A | * | 6/1996 | Au et al. .................... 327/310 |
| 5,546,038 A | * | 8/1996 | Croft ........................... 327/310 |
| 5,631,793 A | * | 5/1997 | Ker et al. ..................... 361/56 |
| 5,959,488 A | * | 9/1999 | Lin et al. .................... 327/313 |
| 6,097,235 A | * | 8/2000 | Hsu et al. ................... 327/309 |
| 6,414,532 B1 | * | 7/2002 | Su et al. ...................... 327/310 |
| 6,469,560 B1 | * | 10/2002 | Chang et al. ............... 327/310 |
| 6,507,471 B2 | * | 1/2003 | Colclaser et al. ........... 361/111 |

OTHER PUBLICATIONS

Charvaka Duvvury et al. "Substrate Pump NMOS for ESD Protection Applications", Silicon Technology Development, Texas Instruments, Dallas, Texas, 11 pages.

* cited by examiner

Primary Examiner—Jeffrey Zweizig
(74) Attorney, Agent, or Firm—James E. Parsons; Bever, Hoffman & Harms, LLP (57) ABSTRACT

Systems and methods are disclosed for localized electrostatic discharge protection of integrated circuit input/output pads. The localized clamp is isolated from the main supply voltage clamp and coupled to the input/output pad through low-capacitance diodes.

40 Claims, 6 Drawing Sheets

LOCALIZED ELECTROSTATIC DISCHARGE PROTECTION FOR INTEGRATED CIRCUIT INPUT/OUTPUT PADS

BACKGROUND OF THE INVENTION

1. Field of the Invention

The present invention relates generally to electrical circuits and, more particularly, to electrostatic discharge protection for integrated circuits.

2. Related Art

Electrostatic discharge (ESD) protection is commonly employed to protect electrical circuits and devices. For example, input/output (I/O) pads of integrated circuits generally require ESD protection. For high-frequency applications, the I/O pads require low-capacitance ESD protection devices to reduce capacitive loading and increase the quality factor. However, the low-capacitance requirement forces the use of protection diodes having a smaller junction area, which degrades their ESD performance.

The low-capacitance forward-biased diodes are typically coupled to one large supply voltage (Vcc) ESD clamp diode. However, the metal bus interconnect resistor-capacitor (RC) time delay from the I/O pad to the large supply voltage ESD clamp diode can significantly degrade ESD performance. As a result, there is a need for an improved ESD circuit.

BRIEF SUMMARY OF THE INVENTION

Electrostatic discharge protection systems and methods are disclosed herein. In accordance with some embodiments, localized supply voltage (Vcc) clamps are provided in close proximity to input/output pads to absorb electrostatic discharge energy applied to the input/output pads. The localized supply voltage (Vcc) clamps can be designed to be independent from the main supply voltage (Vcc) electrostatic discharge protection. The localized clamping technique enhances electrostatic discharge protection of low-capacitance input/output protection diodes designed for high-frequency applications.

In accordance with one embodiment of the present invention, an integrated circuit includes an input/output pad, a supply voltage pad, a first diode coupling the input/output pad to the supply voltage pad, a second diode coupling the input/output pad to a ground terminal, and a first transistor coupled to the first diode and to the ground terminal to absorb electrostatic discharge flowing through the input/output pad.

In accordance with another embodiment of the present invention, a method of providing electrostatic discharge protection for an input/output pad of an integrated circuit includes providing a first diode to couple the input/output pad to a supply voltage pad; providing a second diode to couple the input/output pad to a ground terminal; and providing a localized clamping circuit, for the input/output pad, having a first transistor coupled to the supply voltage pad to absorb electrostatic discharge flowing through the input/output pad and the first diode.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION OF THE INVENTION

Figure 1A:
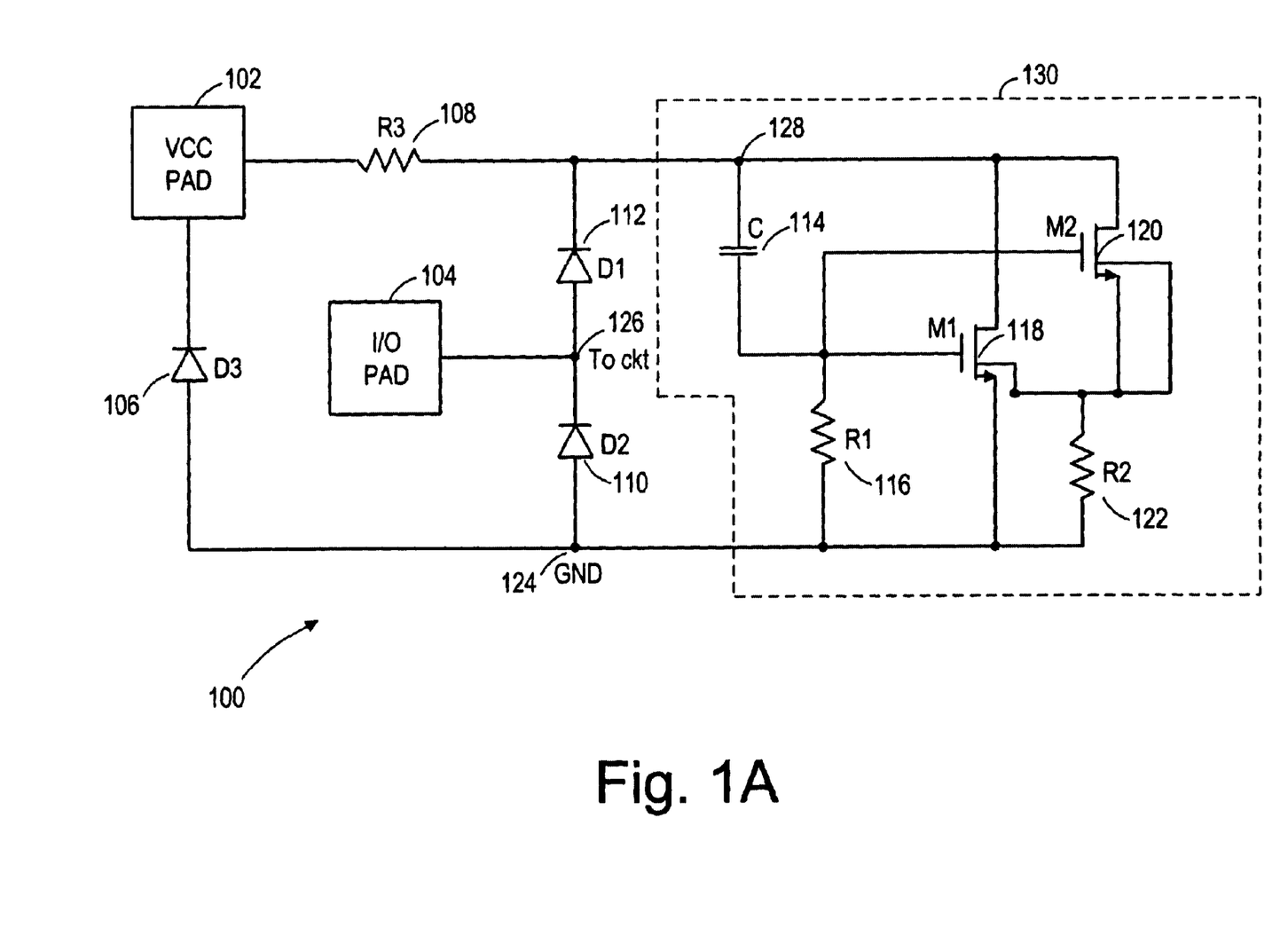
FIG. 1A shows a circuit for electrostatic discharge in accordance with an embodiment of the present invention.

FIG. 1A shows a circuit 100 for electrostatic discharge (ESD) protection in accordance with an embodiment of the present invention. Circuit 100 includes a supply voltage (Vcc) pad 102, an input/output (I/O) pad 104, diodes 106, 110, and 112, resistors 108, 116, and 122, a capacitor 114, and transistors 118 and 120.

A supply voltage (Vcc) is applied to supply voltage (Vcc) pad 102. Various information, depending upon the application and integrated circuit design, flows through I/O pad 104. For example, I/O pad 104 is used to transfer data either into or out of the integrated circuit at a high data rate. Circuitry (not shown), within the integrated circuit and coupled to I/O pad 104 through a node 126, receive the data from I/O pad 104 or provide the data to I/O pad 104.

Figure 1B:
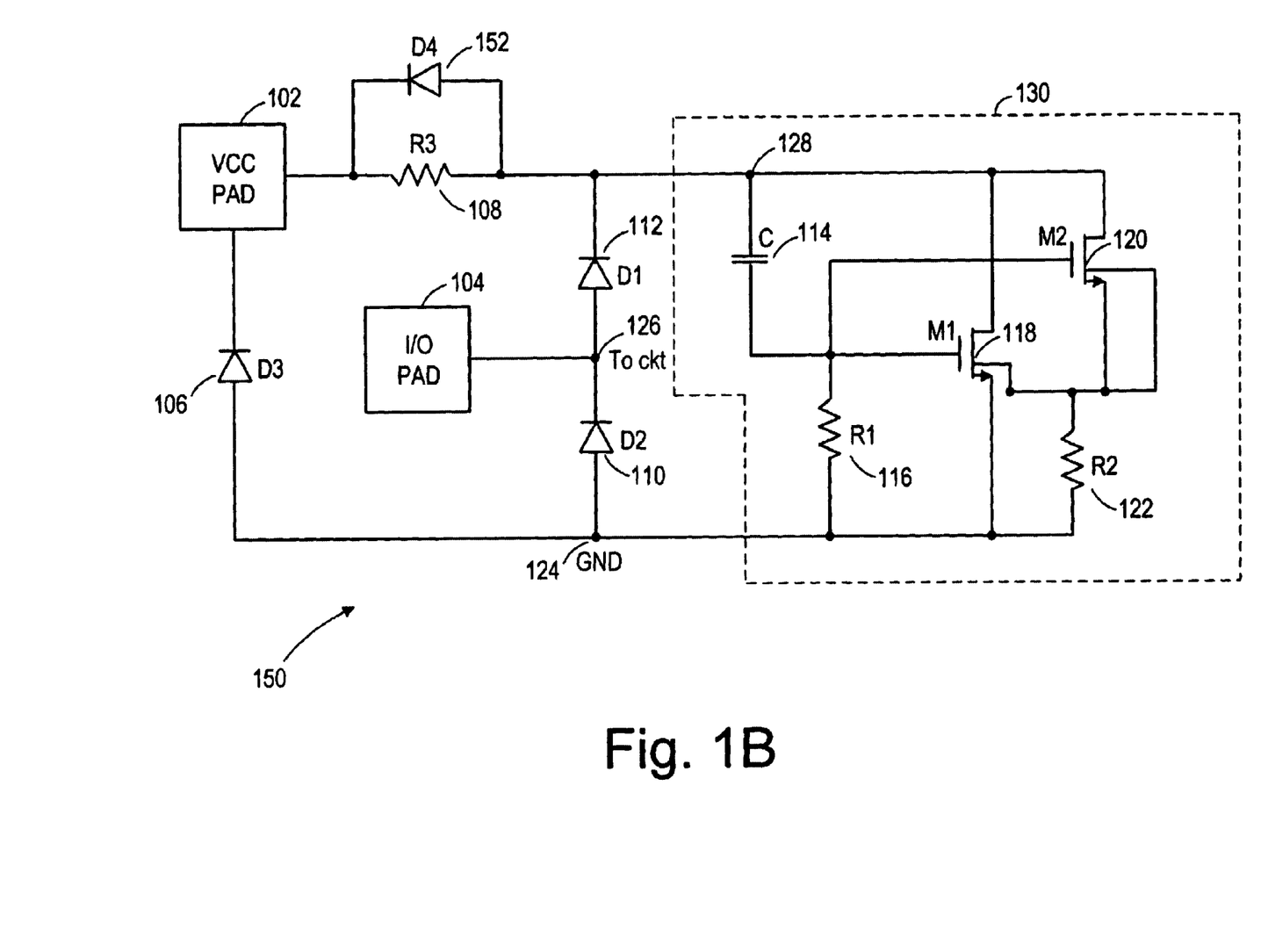
FIG. 1B shows a circuit for electrostatic discharge in accordance with another embodiment of the present invention.
Figure 5:
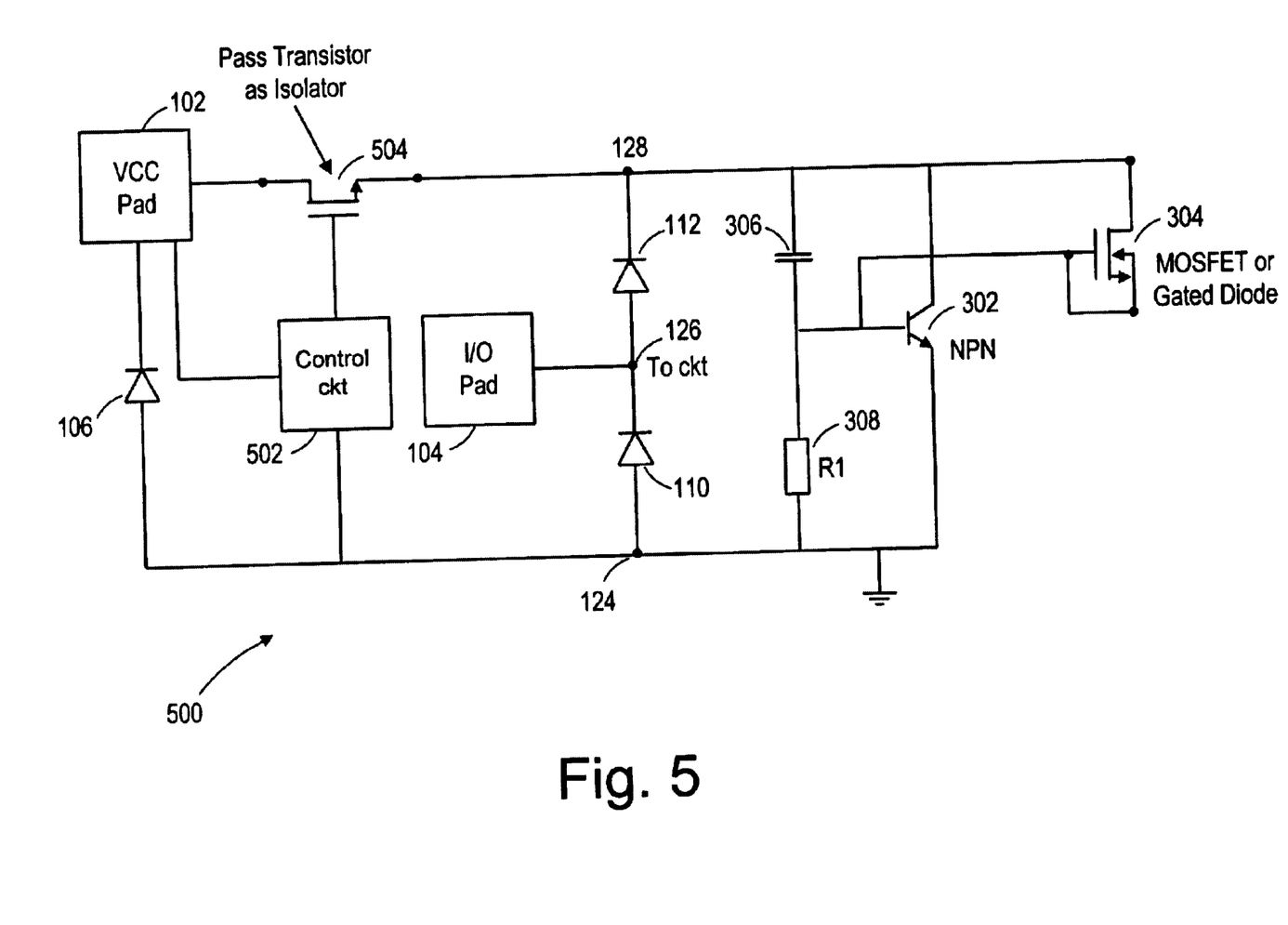
FIG. 5 shows a circuit for electrostatic discharge in accordance with another embodiment of the present invention.

A Capacitor 114, resistors 116 and 122, and transistors 118 and 120 form a local clamping circuit 130 for I/O pad 104. Local clamping circuit 130 is coupled to I/O pad 104 through diodes 110 and 112. The supply voltage (Vcc), when applied to supply voltage (Vcc) pad 102, is coupled to local clamping circuit 130 (e.g., at a node 128) through resistor 108. Resistor 108, resistor 108 in parallel with a diode 152 (as shown in FIG. 1B), or an active clamp (e.g., as shown in FIG. 5), which are optional, provide isolation between local clamping circuit 130 and the elements that provide the main clamping function for supply voltage (Vcc) pad 102. In circuits 100 and 150 (FIGS. 1A and 1B, respectively), diode 106 provides the main clamping function for supply voltage (Vcc) pad 102.

For local clamping circuit 130, transistor 118 is a large clamping MOSFET that provides the supply voltage (Vcc)-to-ground localized clamping for I/O pad 104. Transistor 118 functions to sink the majority of the ESD current, which may flow through I/O pad 104, using its channel and parasitic NPN properties. As shown in FIG. 1A, a drain terminal and a source terminal of transistor 118 are coupled to supply voltage (Vcc) pad 102 (through resistor 108) and ground (labeled GND—at a node 124), respectively.

A substrate of transistor 118 is coupled to a substrate and a source terminal of transistor 120. Alternatively, transistor 120 could be replaced by a gated diode having the same breakdown properties as transistor 118. Transistor 120 is integrated into transistor 118 to pull-up the substrate voltage (i.e., body voltage) of transistor 118 and force the source terminal of transistor 118 to inject a charge and turn-on the parasitic NPN channel of transistor 118 (e.g., at the PN junction of the substrate and the source terminal of transistor 118).

Resistor 116 and capacitor 114 are designed to pull-up a voltage at a gate terminal of transistor 118 during an ESD event. Diodes 110 and 112 are small-capacitance diodes that couple ESD current from I/O pad 104 to local clamping circuit 130 and the ground terminal (e.g., at node 128 and node 124, respectively, with node 128 having a non-ESD event voltage level approximately equal to the supply voltage (Vcc)).

During an ESD event when I/O pad 104 is zapped positive with respect to ground (i.e., the voltage at I/O pad 104 is much greater than the voltage at node 124), diode 112 is forward biased and the entire ESD voltage appears on local clamping circuit 130. The high voltage on the drain terminal of transistor 118 is coupled to its gate terminal, through an internal drain-gate overlap capacitance (Cgd) in parallel with capacitor 114, and allows current to flow through the channel of transistor 118. Additionally, transistor 120, along with resistor 122, pulls-up the substrate voltage of transistor 118 to allow the parasitic NPN action of transistor 118 to trigger into forward conduction.

The ESD current path, when I/O pad 104 is zapped positive with respect to the supply voltage (Vcc), is through forward-biased diode 112, transistor 118 (in parallel with transistor 120 and resistor 122), and forward-biased diode 106. Depending upon the isolator/resistor design, discussed above, a portion of the ESD current could flow directly to supply voltage (Vcc) pad 102. For example with resistor 108, a portion of the ESD current would flow through forward-biased diode 112 and through resistor 108 (or through resistor 108 and diode 152 as shown in FIG. 1B) to supply voltage (Vcc) pad 102.

When I/O pad 104 is zapped negative with respect to ground (i.e., the voltage at I/O pad 104 is less than the voltage at node 124), diode 110 is forward biased and conducts the ESD current. Thus, when I/O pad 104 is zapped negative with respect to the supply voltage (Vcc), diode 106 conducts or forces all of the ESD current through forward-biased diode 110.

Figure 2:
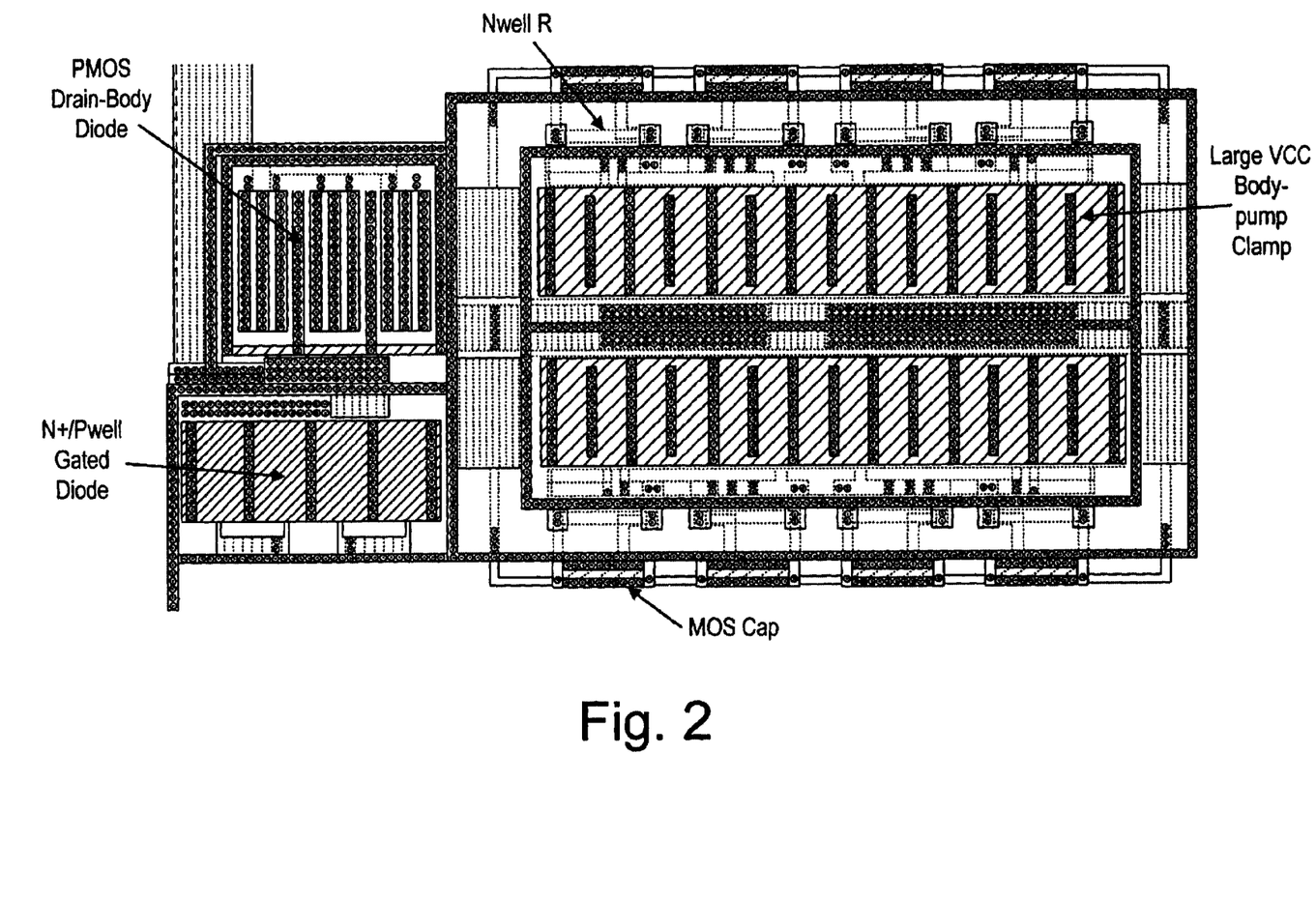
FIG. 2 shows a circuit layout for electrostatic discharge in accordance with an embodiment of the present invention.

FIG. 2 shows an exemplary circuit layout for a portion of circuit 100 that provides electrostatic discharge protection in accordance with an embodiment of the present invention. The circuit layout shown is for 0.5 µm CMOS technology. As illustrated in FIG. 2, I/O pad 104 (not shown) will be coupled to ground through a low-capacitance $N^+/P^{30}$ gated diode (labeled N+/Pwell Gated Diode and corresponding to diode 110 of FIG. 1A) and coupled to the supply voltage (Vcc) through a low-capacitance PMOS drain-body diode (corresponding to diode 112). The exemplary circuit layout is structured such that diodes 110 and 112, capacitor 114, transistors 118 and 120, and resistor 116 can be tuned (i.e., fingers or segments added or shorted out) using metal.

The local supply voltage (Vcc) clamp (i.e., transistor 118) and its body voltage pull-up device (i.e., transistor 120) are integrated together, as shown in FIG. 2 (labeled large VCC Body-pump Clamp). Transistors 118 and 120 are implemented as N-channel MOSFET structures, but can be implemented in accordance with embodiments of the present invention using various NPN-type or silicon controlled rectifier (SCR)-type of devices (as discussed herein, for example, in reference to FIGS. 3 and 4).

In FIG. 2, capacitor 114 (labeled MOS Cap) is designed using a MOSFET and resistor 116 (labeled Nwell R) is designed using Nwell diffusion. Capacitor 114 and resistor 116 are distributed in the circuit layout to allow uniform turn-on of transistor 118 (i.e., the clamping MOSFET).

Figure 3:
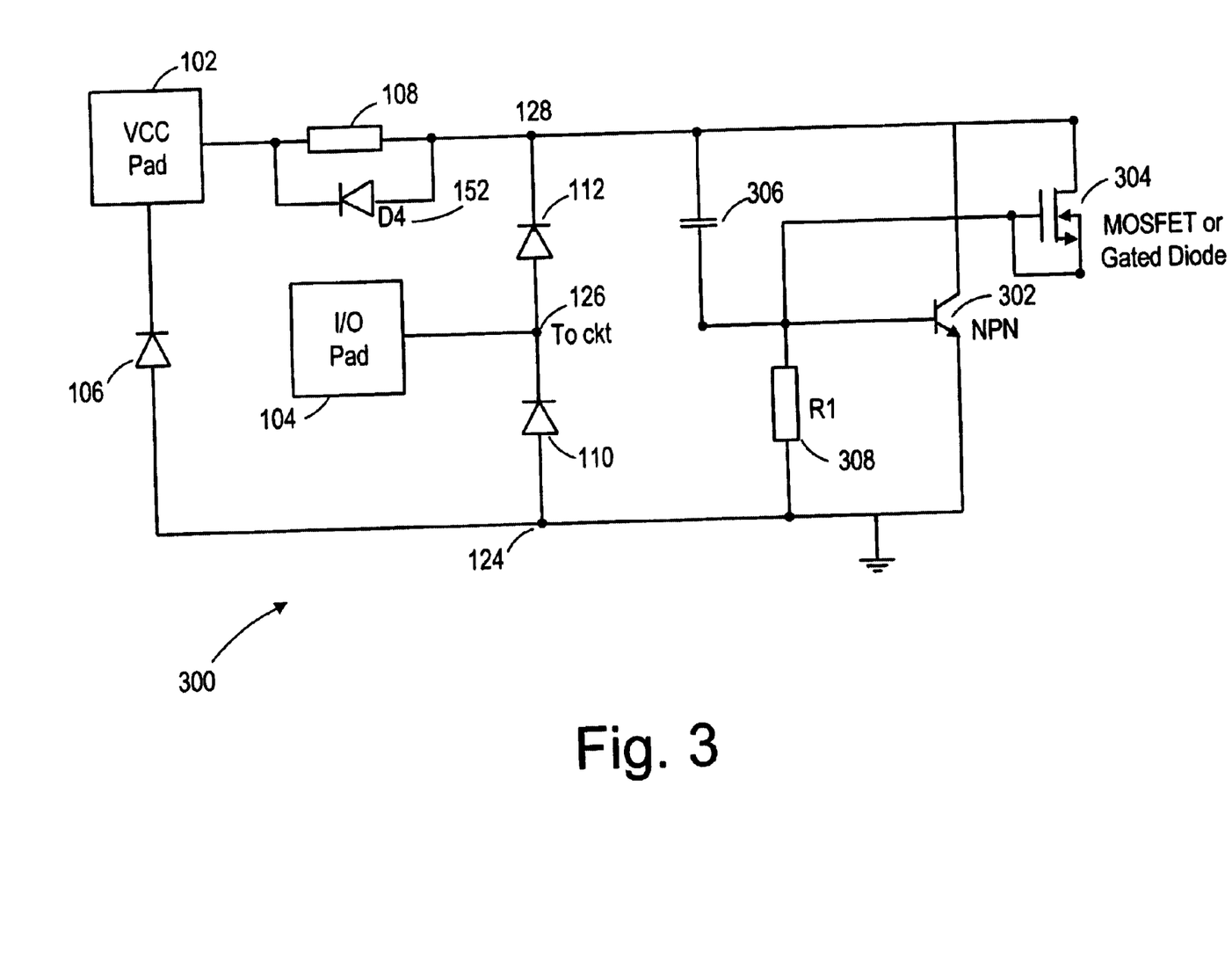
FIG. 3 shows a circuit for electrostatic discharge in accordance with another embodiment of the present invention.
Figure 4:
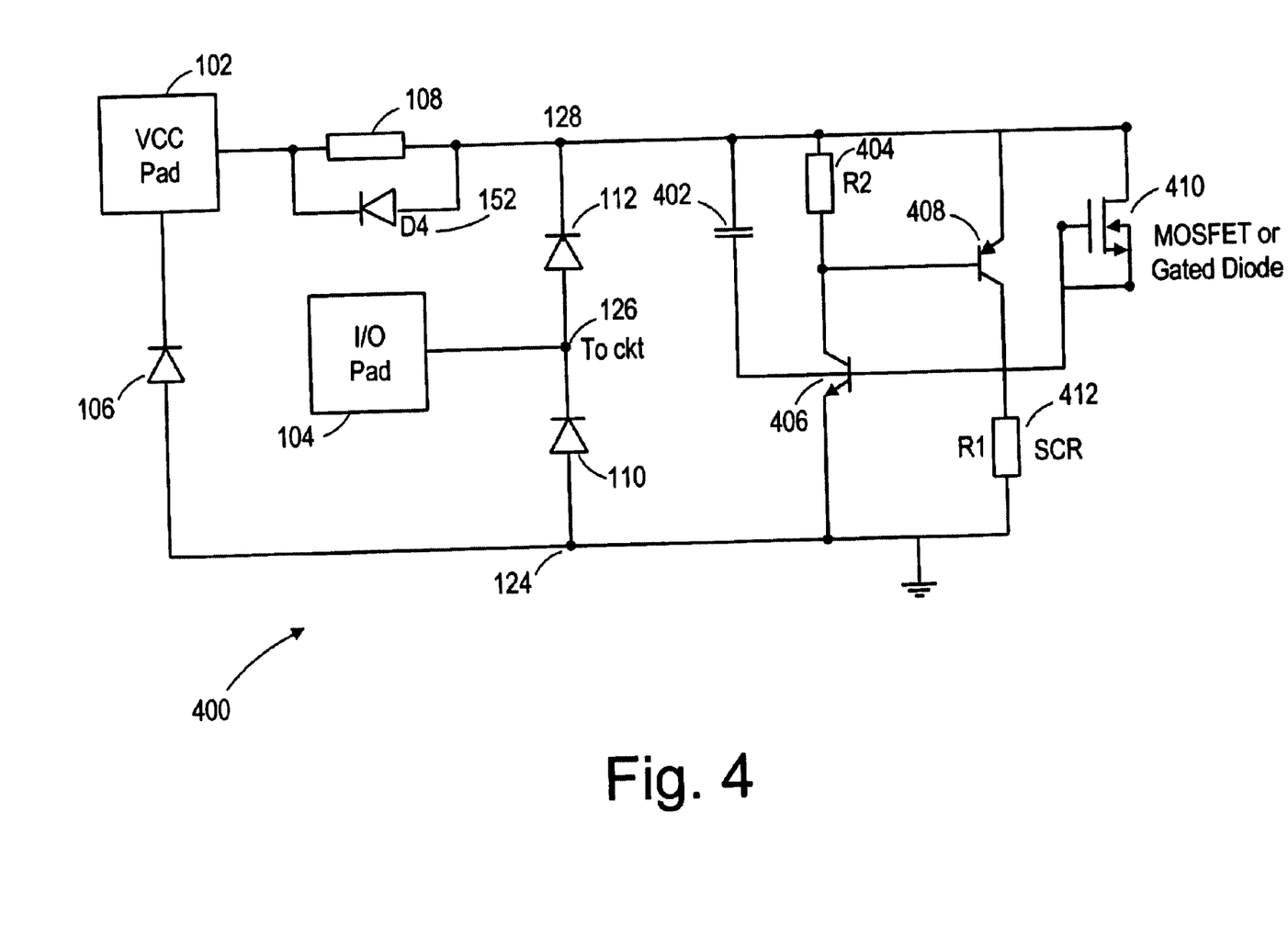
FIG. 4 shows a circuit for electrostatic discharge in accordance with another embodiment of the present invention.

Alternative embodiments of the present invention are disclosed in FIGS. 3 and 4. FIG. 3 shows an exemplary circuit 300 for ESD protection, which includes a capacitor 306, a resistor 308, and transistors 302 and 304. Circuit 300 is similar to circuit 150 (FIG. 1B), but with capacitor 306, resistor 308, and transistors 302 and 304 serving as the local clamping circuit rather than local clamping circuit 130 (as shown in FIG. 1B). For circuit 300, transistor 302 is an NPN device that conducts the main current while transistor 304 assists by pulling-up the base voltage of transistor 302 during an ESD event. Transistor 304 is a small MOSFET device, but alternatively could be substituted with a gated diode to trigger transistor 302.

FIG. 4 shows an exemplary circuit 400 for ESD protection, which includes as the local clamping circuit a capacitor 402 and transistors 406, 408, and 410. Circuit 400 illustrates another form of supply voltage (Vcc)-to-ground clamping using a silicon controlled rectifier (i.e., transistors 406 and 408). During an ESD event, transistor 410 switches on transistor 406, which in turn switches on transistor 408, with transistors 406 and 408 conducting the main current.

Resistors 404 and 412 (labeled R2 and R1, respectively, in FIG. 4) represent the PNP base and NPN base resistances of transistors 408 and 406, respectively. Resistors 404 and 412 can be integrated with the silicon controlled rectifier (SCR) by extending the base of the corresponding NPN and PNP devices (i.e., transistors 406 and 408, respectively). Transistor 410 is a small MOSFET device, but alternatively could be substituted with a gated diode to trigger transistor 406 during an ESD event.

FIG. 5 shows a circuit 500 for electrostatic discharge in accordance with another embodiment of the present invention. Circuit 500 is similar to circuit 300 (FIG. 3), but substitutes an active clamp for resistor 108 and diode 152. The active clamp is exemplified by a transistor 504, which serves as a pass transistor providing isolation during an ESD event. Transistor 504, for example, is a field-oxide or thick-oxide pass transistor controlled via its gate terminal or a bipolar device controlled via its base terminal.

Associated with transistor 504 is a control circuit 502, which is coupled to a gate terminal of transistor 504, to supply voltage (Vcc) pad 102, and to ground (i.e., node 124) to control transistor 504. Control circuit 502 allows current to flow through transistor 504 during normal circuit operation, but switches off transistor 504 to inhibit current flow from supply voltage (Vcc) pad 102 to input/output (I/O) pad 104 during an ESD event (e.g., a two-pin ESD event).

As described herein for some embodiments, low-capacitance (i.e., small junction area) diodes, such as poly diodes or thin film diodes for example, are employed for ESD protection of integrated circuit input/output pads without degrading ESD performance during high-frequency applications. The low-capacitance diodes (e.g., diodes 110 and 112) may also, for example, represent stacked diodes (i.e., two or more diodes in series for each of diode 110 and for diode 112) to further reduce capacitance. The ESD performance is enhanced through localized clamping near the input/output pads as part of a supply voltage (Vcc)-toground clamping network or clamping network from the supply voltage (Vcc) to a secondary voltage level (i.e., other than ground).

Because the localized clamp is coupled to the supply voltage (Vcc), its capacitance does not load the input/output pad and consequently enhances high-frequency operation. The localized clamping network can be designed to be independent of the main supply voltage (Vcc)-to-ground clamp and optimized for any required frequency of the application.

In accordance with one embodiment, the localized clamp is designed using the inherent parasitic NMOS bipolar (e.g., body-to-source junction) with enhanced turn-on using a gate-to-drain coupling capacitor and integrated gated diode or NMOS to trigger bipolar conduction. The localized clamp is coupled to the input/output pad using the low-capacitance gated diodes.

Embodiments described above illustrate but do not limit the invention. It should also be understood that numerous modifications and variations are possible in accordance with the principles of the present invention. For example, the techniques described herein are not limited to CMOS technology, but are applicable to various types of integrated circuit processing or technologies, such as BiCMOS, DMOS, and SiGe technologies or designs. Accordingly, the scope of the invention is defined only by the following claims.

I claim:

1. An integrated circuit comprising:
   an input/output pad;
   a supply voltage pad;
   a first diode coupling the input/output pad to the supply voltage pad;
   a second diode coupling the input/output pad to a ground terminal; and
   a first transistor coupled between the supply voltage pad and the ground terminal, whereby the first transistor is coupled to the first diode, and wherein the first transistor is configured to absorb electrostatic discharge flowing through the input/output pad.

2. The integrated circuit of claim 1, further comprising:
   a capacitor coupled to the first diode and to a gate terminal of the first transistor; and
   a first resistor coupled to the gate terminal of the first transistor and to the ground terminal.

3. The integrated circuit of claim 2, further comprising:
   a second transistor coupled to the first diode and to the first transistor, with a gate terminal of the second transistor coupled to the gate terminal of the first transistor; and
   a second resistor coupled to a substrate terminal of the second transistor and to the ground terminal.

4. The integrated circuit of claim 3, wherein the second transistor is a gated diode.

5. The integrated circuit of claim 3, wherein a substrate terminal of the first transistor is coupled to the substrate terminal and a source terminal of the second transistor.

6. The integrated circuit of claim 1, further comprising an isolation resistor coupling the first diode to the supply voltage pad.

7. The integrated circuit of claim 6, further comprising an isolation diode, in parallel with the isolation resistor, coupling the first diode to the supply voltage pad.

8. The integrated circuit of claim 1, further comprising an active clamp coupling the first diode to the supply voltage pad.

9. The integrated circuit of claim 1, further comprising a third diode coupled to the supply voltage pad and to the ground terminal to provide electrostatic discharge protection for the supply voltage pad.

10. An integrated circuit comprising:
    an input/output pad;
    a supply voltage pad;
    a first diode coupling the input/output pad to the supply voltage pad;
    a second diode coupling the input/output pad to a ground terminal;
    a first transistor coupled to the first diode and to the ground terminal to absorb electrostatic discharge flowing through the input/output pad;
    a capacitor coupled to the first diode and to a gate terminal of the first transistor;
    a first resistor coupled to the gate terminal of the first transistor and to the ground terminal;
    a second transistor coupled to the first diode and to the first transistor, with a gate terminal of the second transistor coupled to the gate terminal of the first transistor; and
    a second resistor coupled to a substrate terminal of the second transistor and to the ground terminal.

11. The integrated circuit of claim 10, wherein the second transistor is a gated diode.

12. The integrated circuit of claim 10, wherein a substrate terminal of the first transistor is coupled to the substrate terminal and a source terminal of the second transistor.

13. An integrated circuit comprising:
    an input/output pad;
    a supply voltage pad;
    a first diode coupling the input/output pad to the supply voltage pad;
    a second diode coupling the input/output pad to a ground terminal;
    a first transistor coupled to the first diode and to the ground terminal to absorb electrostatic discharge flowing through the input/output pad; and
    an isolation resistor coupling the first diode to the supply voltage pad.

14. The integrated circuit of claim 13, further comprising an isolation diode, in parallel with the isolation resistor, coupling the first diode to the supply voltage pad.

15. An integrated circuit comprising:
    an input/output pad;
    a supply voltage pad;
    a first diode coupling the input/output pad to the supply voltage pad;
    a second diode coupling the input/output pad to a ground terminal;
    a first transistor coupled to the first diode and to the ground terminal to absorb electrostatic discharge flowing through the input/output pad; and
    an active clamp coupling the first diode to the supply voltage pad.

16. An integrated circuit comprising:
    an input/output pad;
    a supply voltage pad;
    a first diode coupling the input/output pad to the supply voltage pad;
    a second diode coupling the input/output pad to a ground terminal;

a first transistor coupled to the first diode and to the ground terminal to absorb electrostatic discharge flowing through the input/output pad; and a third diode coupled to the supply voltage pad and to the ground terminal to provide electrostatic discharge protection for the supply voltage pad.

17. An integrated circuit comprising:

an input/output terminal;

a supply voltage terminal;

a first diode coupling the input/output terminal to the supply voltage terminal;

a second diode coupling the input/output terminal to a ground terminal; and means coupled to the first diode and between the supply voltage pad and the ground terminal for providing localized electrostatic discharge protection for the input/output terminal.

18. The integrated circuit of claim 17, further comprising a resistor coupling the first diode to the supply voltage terminal.

19. The integrated circuit of claim 18, further comprising a diode, in parallel with the resistor, coupling the first diode to the supply voltage terminal.

20. The integrated circuit of claim 17, further comprising a third diode coupling the supply voltage terminal to the ground terminal.

21. An integrated circuit comprising:

an input/output terminal;

a supply voltage terminal;

a first diode coupling the input/output terminal to the supply voltage terminal;

a second diode coupling the input/output terminal to a ground terminal;

means coupled to the first diode for providing localized electrostatic discharge protection for the input/output terminal; and a resistor coupling the first diode to the supply voltage terminal.

22. The integrated circuit of claim 21, further comprising a diode, in parallel with the resistor, coupling the first diode to the supply voltage terminal.

23. An integrated circuit comprising:

an input/output terminal;

a supply voltage terminal;

a first diode coupling the input/output terminal to the supply voltage terminal;

a second diode coupling the input/output terminal to a ground terminal;

means coupled to the first diode for providing localized electrostatic discharge protection for the input/output terminal; and a third diode coupling the supply voltage terminal to the ground terminal.

24. A method of providing electrostatic discharge protection for an input/output pad of an integrated circuit, the method comprising:

providing a first diode to couple the input/output pad to a supply voltage pad;

providing a second diode to couple the input/output pad to a ground terminal; and providing a localized clamping circuit, for the input/output pad, having a first transistor coupled between the supply voltage pad and the ground terminal to absorb electrostatic discharge flowing through the input/output pad and the first diode.

25. The method of claim 24, further comprising providing an isolation element between the supply voltage pad and the first diode to isolate the localized clamping circuit from the supply voltage pad.

26. The method of claim 25, further comprising providing a diode coupled to the supply voltage pad and to the ground terminal to provide electrostatic discharge protection for the supply voltage pad.

27. A method of providing electrostatic discharge protection for an input/output pad of an integrated circuit, the method comprising:

providing a first diode to couple the input/output pad to a supply voltage pad;

providing a second diode to couple the input/output pad to a ground terminal;

providing a localized clamping circuit, for the input/output pad, having a first transistor coupled between the supply voltage pad and the ground terminal to absorb electrostatic discharge flowing through the input/output pad and the first diode; and providing an isolation element between the supply voltage pad and the first diode to isolate the localized clamping circuit from the supply voltage pad.

28. The method of claim 27, further comprising providing a diode coupled to the supply voltage pad and to the ground terminal to provide electrostatic discharge protection for the supply voltage pad.

29. An integrated circuit comprising:

an input/output terminal;

a supply voltage terminal;

a first diode coupled to the input/output terminal;

an isolation element coupling the first diode to the supply voltage terminal;

a second diode coupling the input/output terminal to a first voltage terminal; and a first transistor coupled to the first diode and to the first voltage terminal to absorb electrostatic discharge flowing through the input/output terminal.

30. The integrated circuit of claim 29, further comprising:

a capacitor coupled to the first diode and to the first transistor;

a resistor coupled to the capacitor, a gate terminal of the first transistor, and to the first voltage terminal; and a gated diode coupled to the first transistor and to the first diode to pull-up a substrate voltage of the first transistor during an electrostatic discharge event.

31. The integrated circuit of claim 30, wherein the gated diode comprises a second transistor.

32. The integrated circuit of claim 30, further comprising a second resistor coupled to the first transistor and to the first voltage terminal to assist the gated diode pull-up the substrate voltage of the first transistor during an electrostatic discharge event.

33. The integrated circuit of claim 29, further comprising:

a capacitor coupled to the first diode and to a gate terminal of the first transistor; and a second transistor coupled to the first diode and to the gate terminal of the first transistor.

34. The integrated circuit of claim 33, wherein the second transistor pulls-up a voltage level of the gate terminal of the first transistor during an electrostatic discharge event.

35. The integrated circuit of claim 34, wherein the second transistor comprises a gated diode.

36. The integrated circuit of claim 29, further comprising:
a capacitor coupled to the first diode and to a gate terminal of the first transistor;
a second transistor coupled to the first diode and to the first transistor; and
a third transistor coupled to the first diode and to the first transistor.

37. The integrated circuit of claim 36, wherein the third transistor pulls-up a voltage level of the gate terminal of the first transistor during an electrostatic discharge event.

38. The integrated circuit of claim 36, wherein the third transistor comprises a gated diode.

39. The integrated circuit of claim 29, wherein the first voltage terminal is at a ground voltage potential.

40. The integrated circuit of claim 29, wherein the isolation element is a resistor, a resistor in parallel with a diode, or an active clamp.

* * * * *